United States Patent
Varghese

(10) Patent No.: US 11,158,667 B2
(45) Date of Patent: Oct. 26, 2021

(54) OPTOELECTRONIC SEMICONDUCTOR COMPONENT

(71) Applicant: OSRAM OLED GmbH, Regensburg (DE)

(72) Inventor: Tansen Varghese, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 125 days.

(21) Appl. No.: 16/624,943

(22) PCT Filed: Jun. 14, 2018

(86) PCT No.: PCT/EP2018/065842
§ 371 (c)(1),
(2) Date: Dec. 20, 2019

(87) PCT Pub. No.: WO2018/234154
PCT Pub. Date: Dec. 27, 2018

(65) Prior Publication Data
US 2021/0028224 A1    Jan. 28, 2021

(30) Foreign Application Priority Data
Jun. 21, 2017 (DE) ...................... 10 2017 113 741.6

(51) Int. Cl.
*H01L 27/15*    (2006.01)
*H01L 25/18*    (2006.01)

(52) U.S. Cl.
CPC ............ *H01L 27/156* (2013.01); *H01L 25/18* (2013.01)

(58) Field of Classification Search
None
See application file for complete search history.

(56) References Cited

U.S. PATENT DOCUMENTS

2012/0127693 A1    5/2012    Lai et al.
2015/0021636 A1    1/2015    Mandl et al.
(Continued)

FOREIGN PATENT DOCUMENTS

DE    102012112302 A1    6/2014
FR    3061358 A1    6/2018
(Continued)

OTHER PUBLICATIONS

International Search Report issued in the corresponding International application No. PCT/EP2018/065842 dated Sep. 5, 2018, 17 pages. (reference purpose only).
(Continued)

*Primary Examiner* — Robert K Carpenter
(74) *Attorney, Agent, or Firm* — Viering, Jentschura & Partner mbB

(57) ABSTRACT

An optoelectronic semiconductor component for the emission of multicolored radiation may have a multiplicity of active regions arranged next to one another. The active regions may be configured as microrods or nanorods and configured to generate primary electromagnetic radiation. A first group of the active regions may respectively be followed in an emission direction by a first luminescence conversion element, which is suitable for converting the primary radiation into first secondary radiation. A second group of the active regions is respectively followed in the emission direction by a second luminescence conversion element, which is suitable for converting the primary radiation into second secondary radiation. The primary radiation, the first secondary radiation, and the second secondary radiation having different colors.

15 Claims, 13 Drawing Sheets

(56) References Cited

U.S. PATENT DOCUMENTS

| | | |
|---|---|---|
| 2015/0325598 A1 | 11/2015 | Pfeuffer et al. |
| 2016/0141469 A1 | 5/2016 | Robin et al. |
| 2016/0190110 A1 | 6/2016 | Goeoetz et al. |
| 2016/0300983 A1 | 10/2016 | Strassburg et al. |
| 2017/0358719 A1 | 12/2017 | Scholz et al. |
| 2019/0334064 A1 | 10/2019 | Pourquier et al. |
| 2021/0028224 A1* | 1/2021 | Varghese ............... H01L 33/08 |

FOREIGN PATENT DOCUMENTS

| | | |
|---|---|---|
| WO | 2015024801 A1 | 2/2015 |
| WO | 2015091754 A1 | 6/2015 |
| WO | 2016087605 A1 | 6/2016 |
| WO | 2016180885 A1 | 11/2016 |

OTHER PUBLICATIONS

Search Report issued in the corresponding German patent application No. 102017113741.6 dated Apr. 25, 2018, 8 pages. (reference purpose only).

\* cited by examiner

OPTOELECTRONIC SEMICONDUCTOR COMPONENT

CROSS-REFERENCE TO RELATED APPLICATIONS

The present application is a national stage entry according to 35 U.S.C. § 371 of PCT application No.: PCT/EP2018/065842 filed on Jun. 14, 2018; which claims priority to German Patent Application Serial No. 10 2017 113 741.6, which was filed on Jun. 21, 2017; both of which are incorporated herein by reference in their entirety and for all purposes.

TECHNICAL FIELD

The invention relates to an optoelectronic semiconductor component which is suitable for the emission of multicolored radiation.

BACKGROUND

An optoelectronic semiconductor component having a multiplicity of active regions arranged next to one another, which are configured as microrods or nanorods, is known for example from Document WO 2015/091754 A1.

SUMMARY

An object to be achieved is to provide an improved optoelectronic semiconductor component for the emission of multicolored radiation, which is distinguished by a high resolution and high efficiency and, in particular, is usable as a multicolored illumination device or display.

This object is achieved by an optoelectronic semiconductor component according to the independent patent claim.

According to at least one embodiment, the optoelectronic semiconductor component includes a multiplicity of active regions arranged next to one another, which in particular are configured as microrods or nanorods and are adapted to generate primary electromagnetic radiation.

In a non-limiting embodiment, the active regions generate primary radiation in the spectral range of visible light, in particular blue light, during operation. This does not exclude the possibility that the primary radiation also contains violet or UV radiation. The optoelectronic semiconductor component may, in particular, include a hundred or a thousand or more active regions.

The active regions are, in particular, arranged at least partially at a distance from one another. This means that the active regions do not touch at least in regions, but are configured as regions separated from one another at least in regions. The active regions may, for example, be arranged at a distance from one another at least in regions in lateral directions which extend parallel to a main extent plane of the optoelectronic semiconductor component. The active regions may in this case, for example, be connected to one another on their bottom surfaces or their top surfaces by a common material, in particular an electrically conductive layer. In particular, however, the regions of the active regions which emit electromagnetic radiation during operation of the optoelectronic semiconductor component are arranged at a distance from one another.

The active regions may respectively have a main extent direction. The main extent directions of a majority, for example all, of the active regions may extend parallel to one another within the limits of production tolerance. The main extent direction extends, for example, perpendicularly to the lateral direction in which the active regions are arranged at a distance from one another.

According to at least one embodiment of the optoelectronic semiconductor component, a first group of the active regions is followed in an emission direction by a first luminescence conversion element, which is suitable for converting the primary radiation into first secondary radiation. The emission direction may, in particular, extend parallel to the main extent direction of the active regions. The first luminescence conversion element contains, in particular, a first luminescent material, which is suitable for converting the primary radiation into the first secondary radiation with a different, in particular longer, wavelength. For example, the primary radiation includes blue light and the first secondary radiation includes red light. Suitable luminescent materials for the wavelength conversion of the radiation of optoelectronic components are known per se to the person skilled in the art and will therefore not be described further.

According to at least one embodiment of the optoelectronic semiconductor component, a second group of the active regions is followed in the emission direction by a second luminescence conversion element, which is suitable for converting the primary radiation into second secondary radiation. The second luminescence conversion element contains, in particular, a second luminescent material which is different to the first luminescent material and is suitable for converting the primary radiation into the second secondary radiation with a different, in particular longer, wavelength. Advantageously, the primary radiation, the first secondary radiation and the second secondary radiation have different colors. For example, the primary radiation includes blue light, the first secondary radiation includes red light and the second secondary radiation includes green light.

The first and second luminescence conversion elements may, for example, include at least one luminescent material introduced into a matrix material. As an alternative, the luminescence conversion elements may, for example, be formed by epitaxially deposited layers (so called epi converters). The epitaxial layers may in this case initially be bonded onto the optoelectronic semiconductor component and then structured, for example by selective etching, in order to form the individual luminescence conversion elements.

The effect achieved by the application of the first luminescence conversion elements onto the first group of the active regions and the second luminescence conversion elements onto the second group of the active regions is, in particular, that the microrods or nanorods are suitable for the emission of radiation of different colors. In this way, an optoelectronic semiconductor component is achieved which is distinguished by a high resolution and a high efficiency and is suitable for the emission of multicolored radiation.

A particularly high resolution may, in particular, be achieved by small spacings between the active regions. According to at least one embodiment of the optoelectronic semiconductor component, the spacings of neighboring active regions are less than 10 µm, particularly in the range of between 50 nm and 10 µm.

According to at least one embodiment of the optoelectronic semiconductor component, a third group of the active regions is not followed in an emission direction by a luminescence conversion element. The active regions of the first group therefore emit the primary radiation in the emission direction. The optoelectronic semiconductor component is, in particular, suitable for the emission of radiation of at least three different colors, in particular blue, green and red. The optoelectronic semiconductor component may, in particular, be an RGB light source.

According to at least one embodiment of the optoelectronic semiconductor component, the active regions have a lateral extent, i.e. an extent perpendicularly to their main extent direction, of between 20 nm and 5 µm. In the main extent direction, the active regions have a length which is greater than the diameter. For example the length of the active regions is at least two times as great as the diameter, in particular at least five times as great as the diameter or even at least 50 times as great as the diameter of the active regions.

The adjustment of the size of the active regions in the lateral direction is carried out, for example, by the size of the openings in a mask layer in which the active regions are grown, and in the vertical direction for example by the growth time. The optical properties, in particular the mode guiding, may be influenced by the size of the active regions.

According to at least one embodiment of the optoelectronic semiconductor component, the first and second luminescence conversion elements are arranged in such a way that each active region of the first group is respectively assigned a separate first luminescence conversion element and each active region of the second group is respectively assigned a separate second luminescence conversion element. In other words, a first conversion element or a second luminescence conversion element respectively covers precisely one active region.

According to at least one embodiment of the optoelectronic semiconductor component, the first and second luminescence conversion elements respectively have a lateral extent which is between one and five times as great as the lateral extent of the active regions. Furthermore, the lateral extent of the luminescence conversion elements is not more than half of the spacing between the active regions. The luminescence conversion elements are in this case advantageously dimensioned in such a way that they fully absorb the radiation emerging from the active region assigned to them and convert it into secondary radiation. Depending on the angular distribution of the emitted primary radiation, to this end it may be advantageous for the luminescence conversion elements to include between 100% and 500% of the lateral extent of the active regions.

According to at least one embodiment of the optoelectronic semiconductor component, a radiation exit surface of the optoelectronic semiconductor component includes at least one transparent dielectric layer, the first luminescence conversion elements and the second luminescence conversion elements respectively being arranged in depressions of the at least one dielectric layer. It is also possible for the first luminescence conversion element to be arranged in depressions of a first dielectric layer and for the second luminescence conversion element to be arranged in depressions of a second dielectric layer. The depressions in the at least one dielectric layer may, for example, be produced by a lithography method. Arrangement of the first and second luminescence conversion elements in depressions of at least one dielectric layer has the advantage that the size and position of the first and second luminescence conversion elements can be adjusted accurately by means of the depressions, in particular by means of lithographic production of the depressions. Furthermore, arrangement of the first and second luminescence conversion elements in depressions of at least one dielectric layer has the advantage that the luminescence conversion elements are better protected against mechanical damage.

In another advantageous configuration, the first and the second luminescence conversion elements are advantageously respectively arranged in waveguides. The waveguides may, for example, be formed in a dielectric layer. This configuration has the advantage that the primary radiation B, the first secondary radiation R and the second secondary radiation G are respectively emitted directionally.

In another advantageous configuration, a wavelength-selective mirror is arranged between the active regions and the luminescence conversion elements. The wavelength-selective mirror is, in particular, adapted to reflect at least the predominant part of the first secondary radiation R and second secondary radiation G generated by the luminescence conversion elements and is substantially radiation-transmissive for the primary radiation B. The wavelength-selective mirror may, in particular, be adapted to reflect red or green light and to transmit blue light. In this way, advantageously, the absorption of converted radiation in the optoelectronic semiconductor component is reduced and the efficiency is increased.

According to at least one embodiment of the optoelectronic semiconductor component, the active regions are individually drivable. Advantageously, the active regions in this case include a common electrical contact on a side facing toward the radiation exit surface and separate electrical contacts on a side opposite the radiation exit surface. Furthermore, it is also possible for both contacts of the active regions respectively to be individually drivable.

According to at least one embodiment, the optoelectronic semiconductor component includes a carrier substrate, an electronic circuit for individual driving of the active regions being integrated into the carrier substrate. The carrier substrate having an electronic circuit for individual driving of the active regions may, for example, be produced in CMOS technology.

According to at least one embodiment, the optoelectronic semiconductor component does not include a growth substrate. The growth substrate may, in particular, be separated from the semiconductor component after epitaxial production of the active regions, for example by a laser lift-off method. Separation of the growth substrate makes it possible, in particular, to connect the active regions to a carrier substrate that makes it possible to drive the active regions individually.

According to at least one embodiment, the optoelectronic semiconductor component is an RGB display having a multiplicity of pixels. In a non-limiting embodiment, each pixel includes an active region of the first group, an active region of the second group and an active region of the third group. The pixels therefore respectively contain at least one active region of each color, for example an active region for the emission of blue light, an active region for the emission of green light and an active region for the emission of red light. This does not exclude the possibility that a pixel includes more than three, for example four, active regions.

The active regions include an n-type semiconductor region, which forms a core region. By means of this core region, the active regions may respectively be connected to one another, for example on a bottom surface of the active regions. Furthermore, the active regions may include an active layer, which covers the core region at least in directions transverse to the main extent direction of the active region. This means that the active layer may be formed on lateral surfaces and optionally also on top surfaces of the active regions, and may cover the core region there. In particular, it is however also possible for bottom surfaces and/or top surfaces of the active regions respectively to be free of the active layer and merely for lateral surfaces of the active regions to be covered by the active layer.

Furthermore, the active layers may include a p-type semiconductor region, which forms a top layer that covers the active layer at least in directions transverse to the main extent direction of the active region.

Overall, it is thus possible for a majority, in particular all, of the active regions respectively to include a core region that is respectively covered in directions transverse to the main extent direction of the active region by an active layer, which is in turn respectively covered by a top layer, in particular also in directions transverse to the main extent direction of the active region.

The active regions may in this case, in particular, be so-called core-shell nanorods or core-shell microrods, in which a shell having an active layer is applied around a core that extends in all three spatial directions.

In one alternative configuration, the active regions have a main extent direction, and in the main extent direction, an n-type semiconductor region, the active layer and a p-type semiconductor region are arranged above one another in such a way that they do not overlap in the lateral direction. In this configuration, the nanorods or microrods are disk-type nanorods or microrods, the n-type semiconductor region, the active layer and the p-type semiconductor region being successive disks, having a cylindrical or hexagonal cross section. Such disk-type nanorods or microrods are often referred to as quantum discs.

The active regions may be produced with a II-VI material or III-V material, in particular a III nitride material, for example InAlGaN, and emit, depending on the material composition in the active layer, for example primary radiation having a peak wavelength in a wavelength range of up to at most 550 nm. In this case, the peak wavelength is in particular the wavelength of maximum emission. In a non-limiting embodiment, blue light is generated.

According to at least one embodiment of the optoelectronic semiconductor component, the optoelectronic semiconductor component includes a current spreading layer, which covers the multiplicity of the active regions at least in places. In one possible configuration, the current spreading layer may electrically connect the active regions conductively to one another. For example, the current spreading layer is in direct contact with the top layer of the active regions. The current spreading layer may partially or fully cover the active regions on their exposed outer surface.

The current spreading layer is configured to be radiation-transmissive. The current spreading layer may, in such a case, be formed with a semiconductor material or a transparent conductive oxide. For example, indium tin oxide (ITO) is suitable as a material for forming the current spreading layer. As an alternative or in addition, the current spreading layer may include a metal. The current spreading layer may, for example, consist only of a metal layer or of a combination of a transparent conductive oxide layer with a metal layer. Furthermore, it is possible for the current spreading layer to be formed with a semitransparent conductive material, which is thinly applied. The current spreading layer may in this case, for example, be formed with graphene or consist of graphene.

BRIEF DESCRIPTION OF THE DRAWINGS

The optoelectronic semiconductor component and a method for the production thereof will be explained in more detail below in connection with FIGS. 1 to 6.

In the following description, various aspects are described with reference to the following drawings, in which.

Parts which are the same or have the same effect are respectively provided with the same references in the figures. The parts represented as well as the size ratios of the parts in relation to one another are not to be regarded as true to scale.

DETAILED DESCRIPTION

Figure 1A:
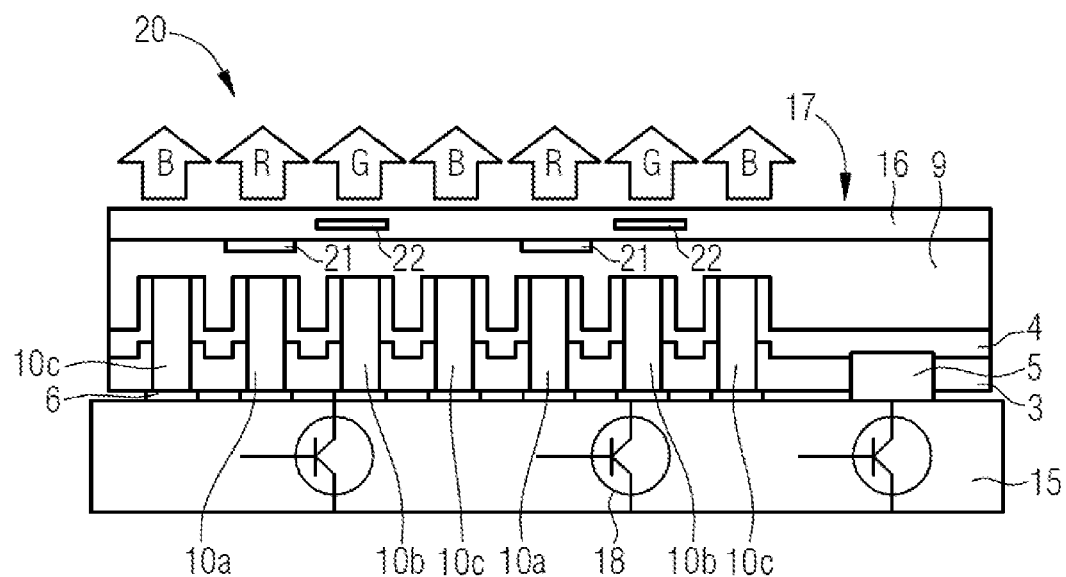
FIG. 1A shows a schematic representation of a cross section through an optoelectronic semiconductor component according to a first exemplary embodiment.

The optoelectronic semiconductor component 20 according to a first exemplary embodiment, as schematically represented in cross section in FIG. 1A, includes a multiplicity of active regions 10a, 10b, 10c which are arranged next to one another over a common carrier substrate 15. In order to simplify the representation, only seven active regions 10a, 10b, 10c are represented in FIG. 1. The actual number of active regions 10a, 10b, 10c in the optoelectronic semiconductor component 20 may be substantially greater, and the optoelectronic semiconductor component 20 may for example include at least fifty, at least one hundred or even at least one thousand active regions 10a, 10b, 10c. The active regions 10a, 10b, 10c may be arranged in a matrix arrangement over the carrier substrate.

The active regions 10a, 10b, 10c are configured, in particular, as microrods or nanorods. One possible exemplary embodiment of an active region 10a, 10b, 10c is represented on an enlarged scale in FIG. 1B. Each active region 10a, 10b, 10c includes an n-type semiconductor region 11, which forms a core region. The core region is enclosed by an active layer 12, which is provided in order to generate electromagnetic radiation. The active layer 12 is enclosed by a p-type semiconductor region 13, which forms a top layer. Such an arrangement of the layers in the microrods or nanorods is also referred to as a core-shell structure.

Figure 1B:
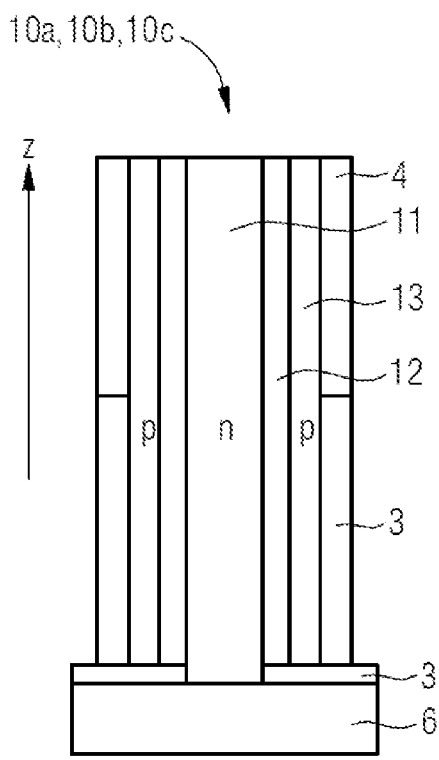
FIG. 1B shows an enlarged representation of one exemplary embodiment of an active region.
Figure 1C:
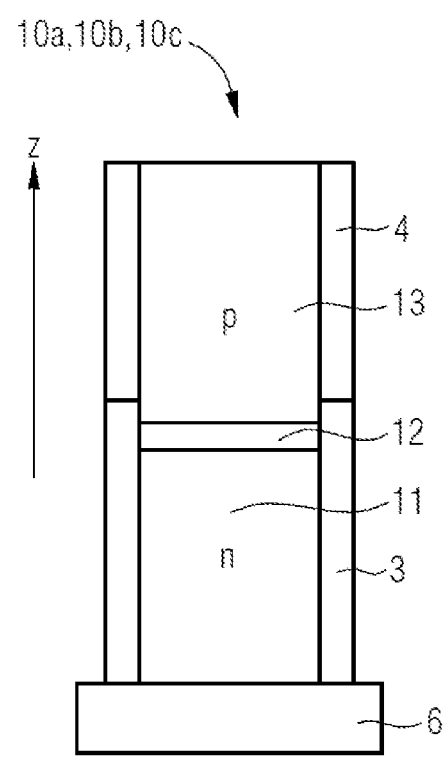
FIG. 1C shows an enlarged representation of one exemplary embodiment of an active region.

One alternative possible configuration of the active regions 10a, 10b, 10c is represented in FIG. 1C. In this configuration, the n-type semiconductor region 11, the active layer 12 and the p-type semiconductor region 13 are arranged above one another in the main extent direction z. The n-type semiconductor region 11, the active layer 12 and the p-type semiconductor region 13 are in this case arranged vertically above one another in the manner of disks.

In both possible configurations of the active regions 10a, 10b, 10c, the semiconductor layers 11, 12, 13 of the optoelectronic semiconductor component 20 are based on a nitride compound semiconductor. In the present context, "based on a nitride compound semiconductor" means that the semiconductor layers, or at least one of these layers, includes a III nitride compound semiconductor material, such as $In_xAl_yGa_{1-x-y}N$, where $0 \leq x \leq 1$, $0 \leq y \leq 1$ and $x+y \leq 1$. In this case, this material need not necessarily have a mathematically exact composition according to the formula above. Rather, it may include one or more dopants as well as additional constituents that essentially do not alter the characteristic physical properties of the $In_xAl_yGa_{1-x-y}N$ material. For the sake of simplicity, however, the formula above only contains the essential constituents of the crystal lattice (In, Al, Ga, N), even though these may be partially replaced with small amounts of other materials.

For example, the n-type semiconductor region 11 includes n-doped GaN, the active layer 12 includes InGaN and the top layer includes p-doped GaN. It is also conceivable for the n-type semiconductor region 11, the active layer 12 and/or the p-type semiconductor region 13 to be composed of a plurality of sublayers. In particular, the active layer 12 may include a single or multiple quantum well structure.

The active regions 10 have a main extent direction z. The active regions 10a, 10b, 10c are configured to be longer along the main extent direction z than they are wide in lateral directions transverse or perpendicular to the main extent direction z.

Figure 1D:
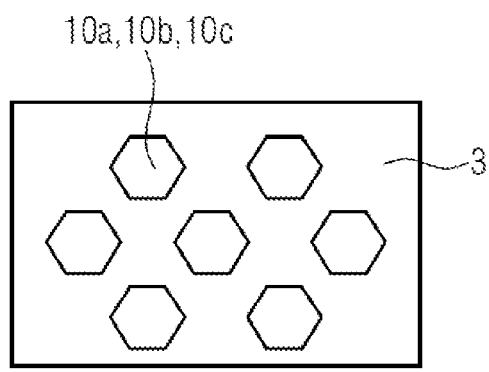
FIG. 1D shows a simplified schematic view of the active regions.

As may be seen in the schematic plan view of some of the active regions 10a, 10b, 10c which is represented in FIG. 1D, the active regions 10a, 10b, 10c may for example have hexagonal base faces. As an alternative, however, other shapes of the base face are also possible.

As represented in FIG. 1A, the electrical contacting of the active regions 10a, 10b, 10c is carried out, for example, by means of a common p-contact 5 and separate n-contacts 6. The p-contact 5 and the n-contacts 6 may, for example, be configured as metal layers. The n-type semiconductor regions 11 are electrically conductively connected to the n-contacts 6 and may, in particular, be directly adjacent to the n-contacts 6. The electrical contacting of the p-type semiconductor regions 13 of the active regions 10a, 10b, 10c is established by means of a current spreading layer 4 which is placed over parts of the p-type semiconductor regions 13 and is connected to the p-contact 5. The current spreading layer 4 is adjacent, particularly in regions, to the p-type semiconductor regions 13 of the active regions 10. The current spreading layer 4 and the p-contact 5 are electrically insulated from the n-contacts 6 by at least one insulation layer 3.

In the embodiment, shown in FIG. 1B, of the active regions 10a, 10b, 10c as core-shell nanorods or microrods, a part of the insulation layer 3 extends on the lower sides of the active regions 10a, 10b, 10c below the active layer 12 and the p-type semiconductor regions 13. Respectively only the n-type semiconductor region 11 is therefore electrically connected to the n-contact 6. During production of the core-shell nanorods or microrods, the insulation layer 3 may be used as a mask during the epitaxial growth for the production of the active regions 10a, 10b, 10c. For example, the n-type semiconductor region 11 functioning as a core may initially be grown in openings of the insulation layer 3, and then the active layer 12 and the p-type semiconductor region 13 may successively be grown over the core.

In the alternative embodiment of the active region 10a, 10b, 10c according to FIG. 1C, the n-type semiconductor region 11 and the active layer 12 are covered in the lateral direction, and in particular electrically insulated from the current spreading layer 4, by an insulation layer 3.

The at least one insulation layer 3 is, for example, formed with a semiconductor oxide or a semiconductor nitride such as silicon oxide or silicon nitride. The current spreading layer 4, which is arranged over the active regions 10a, 10b, 10c, is a transparent layer. The radiation emitted by the optoelectronic semiconductor component 20 may therefore be at least partially extracted through the current spreading layer 4. In particular, the current spreading layer 4 may include a transparent conductive oxide (TCO), for example indium tin oxide (ITO).

The active regions 10a, 10b, 10c emit primary radiation, which includes blue light. The active layers 12 of the active regions 10a, 10b, 10c may respectively include the same semiconductor material, in particular a nitride compound semiconductor material suitable for the emission of blue light. In order to achieve multicolored emission, a first group of active regions 10a is respectively followed in an emission direction by a first luminescence conversion element 21, which is suitable for converting the primary radiation B into first secondary radiation R. The first secondary radiation R is red light. Furthermore, a second group of active regions 10b is respectively followed in an emission direction by a second luminescence conversion element 22, which is suitable for converting the primary radiation B into second secondary radiation G. The second secondary radiation G is green light. A third group of the active regions 10c is advantageously not followed in an emission direction by a luminescence conversion element, so that the active regions 10c of the third group emit the primary radiation B.

The first and second luminescence conversion elements 21, 22 are advantageously respectively arranged in depressions of one or more transparent dielectric layers 9, 16, which are arranged over the active regions 10a, 10b, 10c. The transparent dielectric layers 9, 16 are for example formed from a silicon oxide, in particular $SiO_2$.

The active regions 10a, 10b, 10c are advantageously individually drivable. To this end, an electronic circuit 18 for individual driving of the active regions 10a, 10b, 10c is advantageously integrated into a carrier substrate 15 of the optoelectronic semiconductor component 20. The electronic circuit 18 for driving the active regions 10a, 10b, 10c may, for example, be produced in the carrier substrate 15 in CMOS technology, and is only schematically indicated by transistor symbols in FIG. 1A. The carrier substrate 15 lies opposite a radiation exit surface 17 of the optoelectronic semiconductor component 20.

The optoelectronic semiconductor component 20 may for example be a display, in particular an RGB display. The display in this case includes a multiplicity of pixels, each pixel advantageously respectively including at least one active region 10a of the first group, an active region 10b of the second group and an active region 10c of the third group.

Furthermore, the optoelectronic semiconductor component 20 may be an illumination device which is suitable for the emission of mixed light, in which case the mixed light may be produced by additive color mixing of the active regions 10a, 10b, 10c. By controlled driving of the active regions 10a, 10b, 10c, mixed light of different colors may be generated, for example colored light with a deliberately adjusted color locus. Furthermore, for example, white light with a deliberately adjusted color temperature may be generated.

Figure 2A:
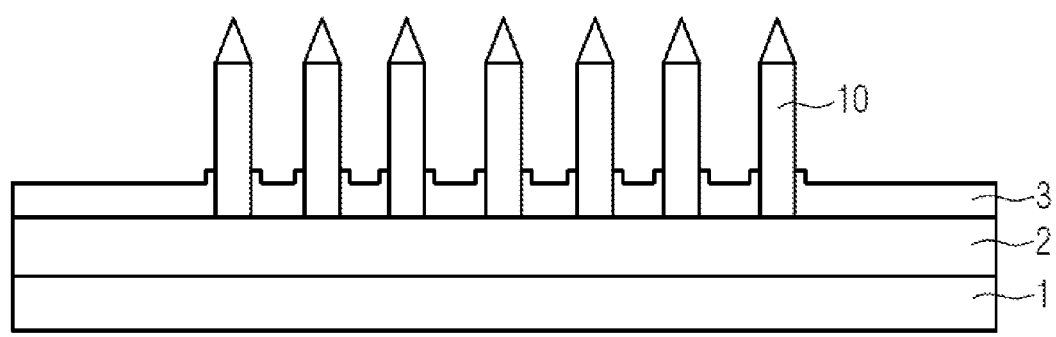
FIGS. 2A to 2O show schematically represented intermediate steps in one exemplary embodiment of a method for producing the optoelectronic semiconductor component.
Figure 2B:
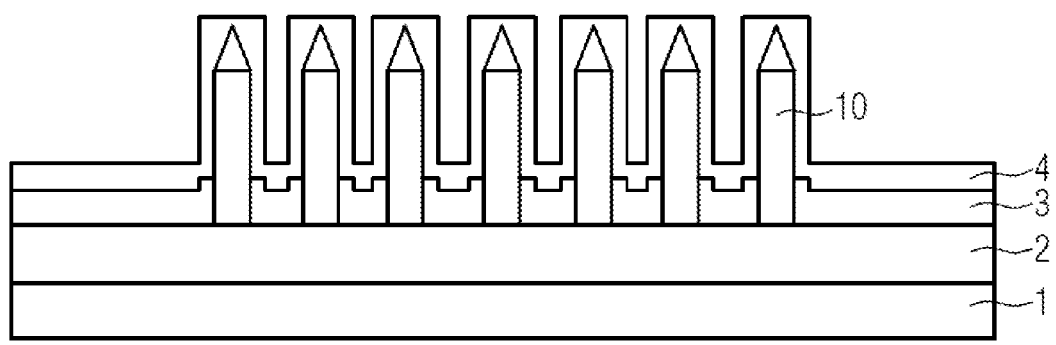
Figure 2C:
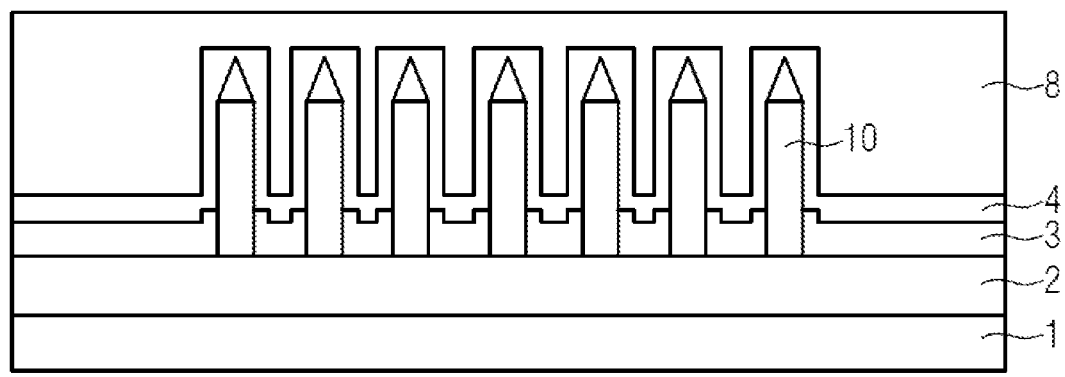
Figure 2D:
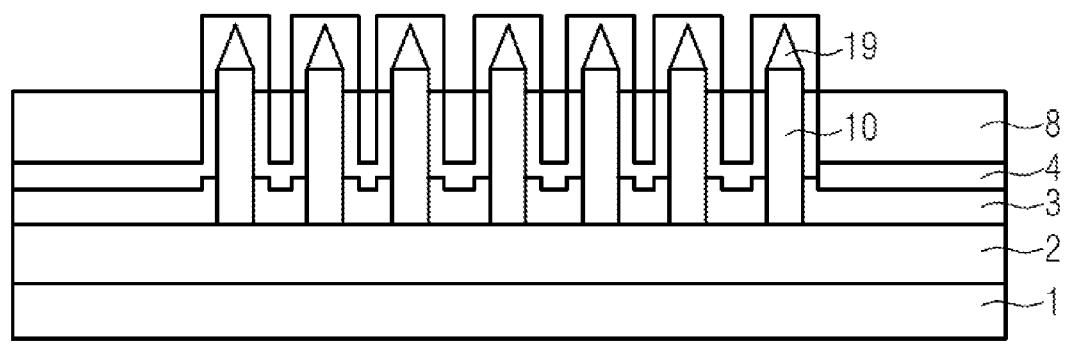
Figure 2E:
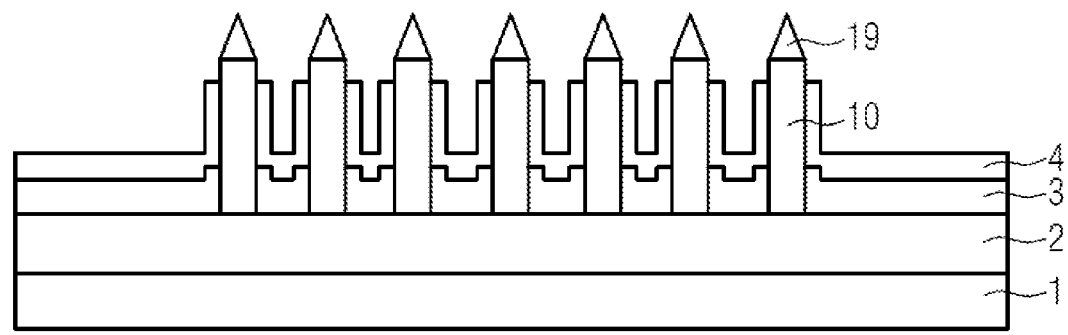
Figure 2F:
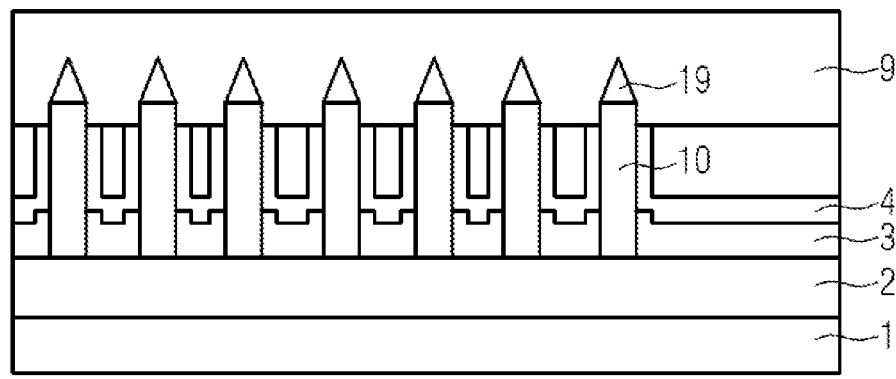
Figure 2G:
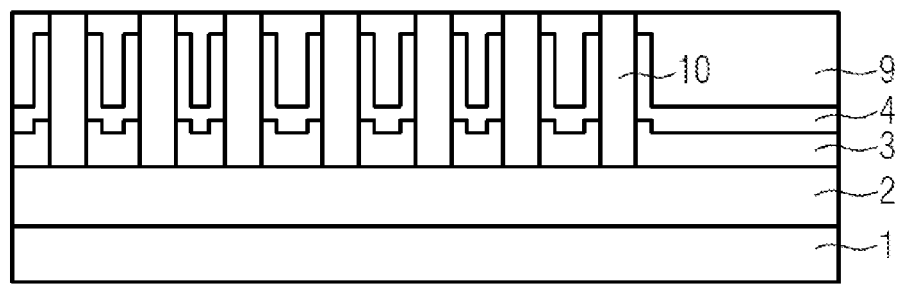
Figure 2H:
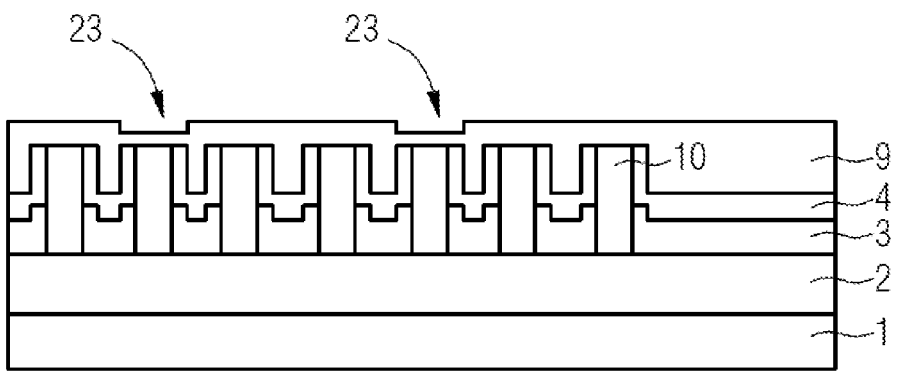
Figure 2I:
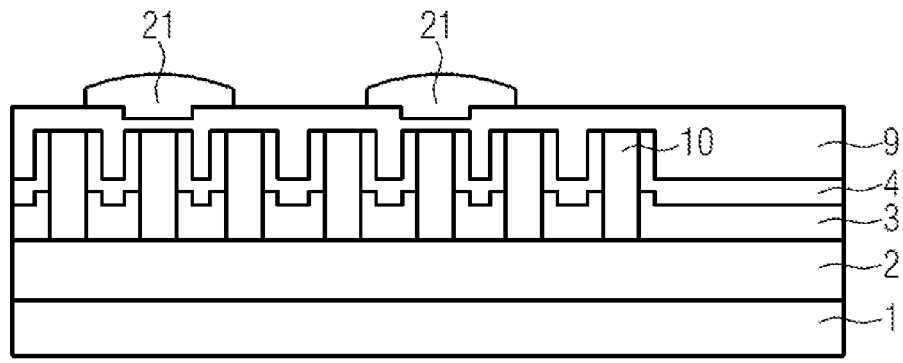
Figure 2J:
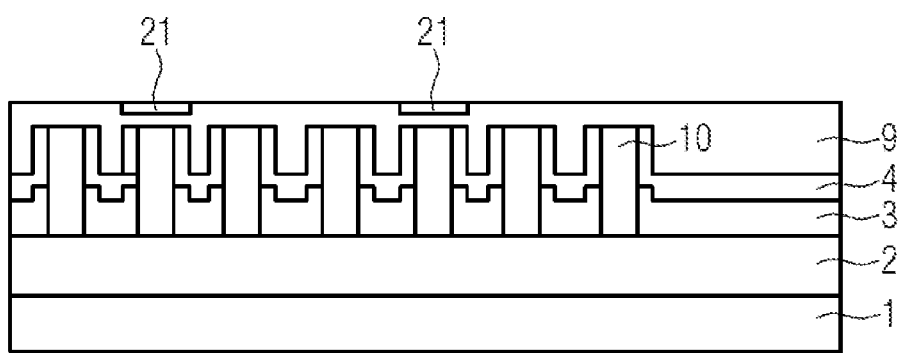
Figure 2K:
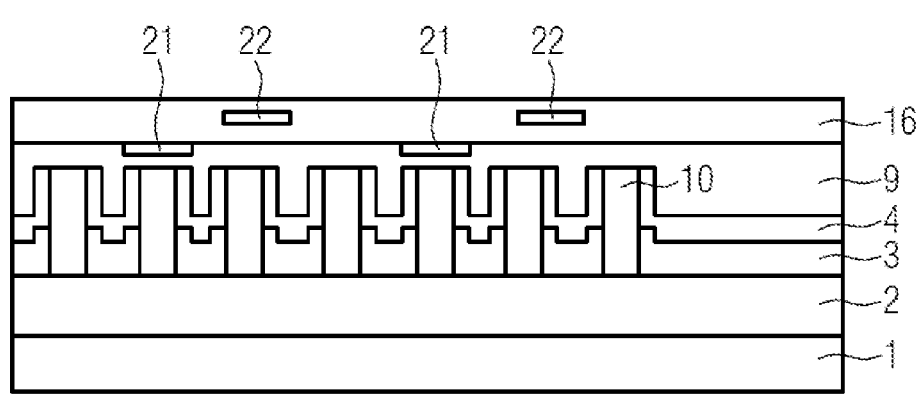
Figure 2L:
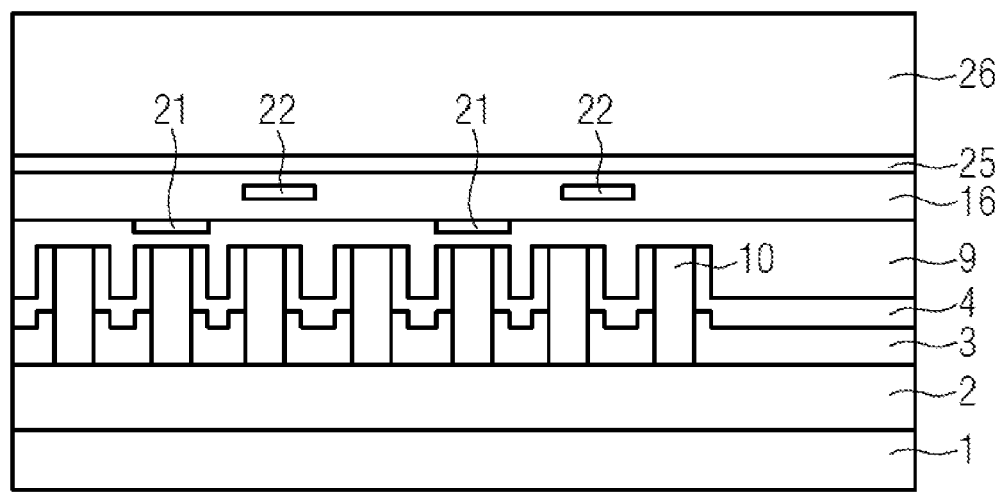
Figure 2M:
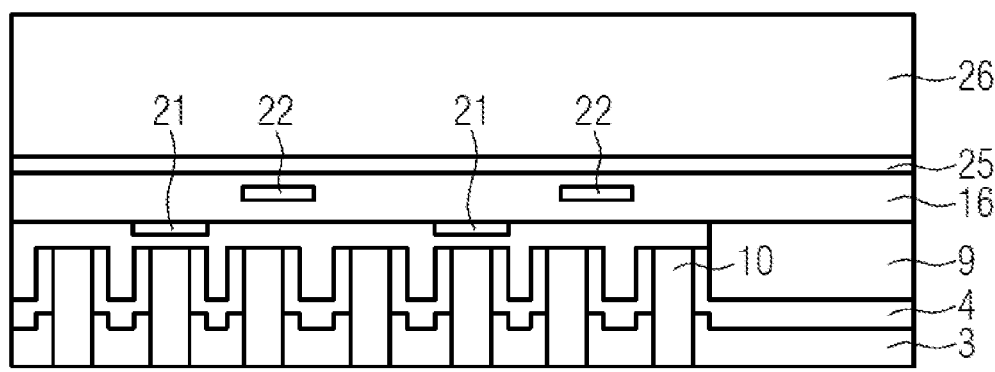
Figure 2N:
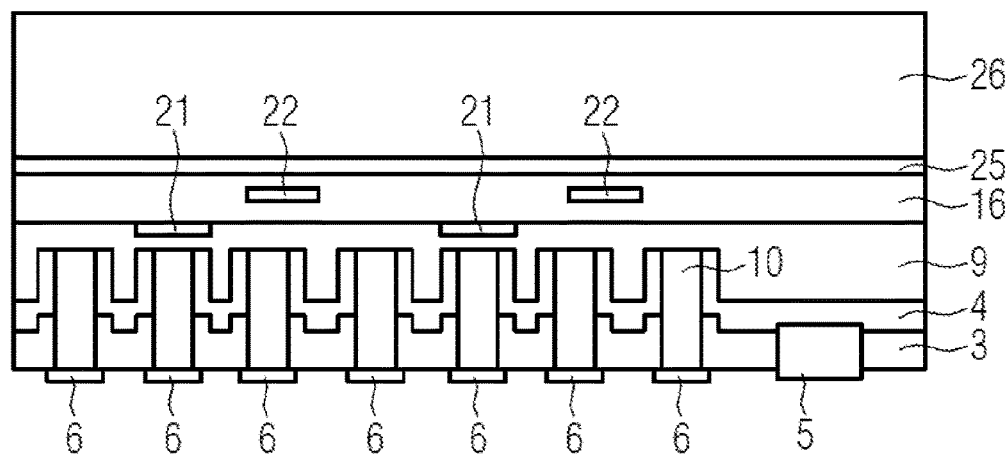
Figure 2O:
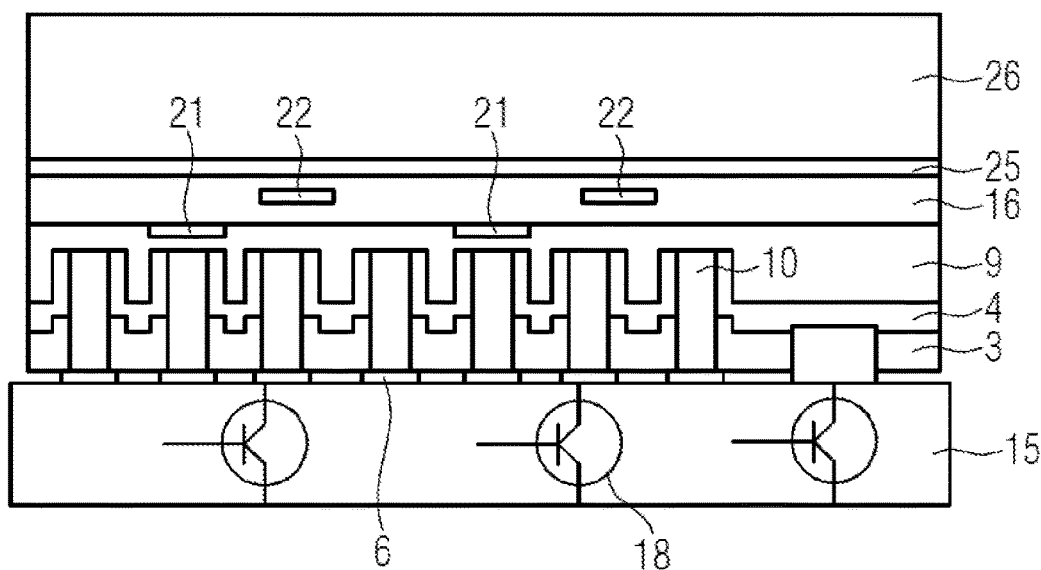

FIGS. 2A to 2O schematically represent intermediate steps of one exemplary embodiment of a method for producing an optoelectronic semiconductor component with which, for example, the optoelectronic semiconductor component according to the first exemplary embodiment may be produced.

In the intermediate step represented in FIG. 2A, active regions 10 have been epitaxially grown on a first semiconductor layer 2, which includes GaN and may, in particular, be n-doped. The first semiconductor layer 2 is grown on a growth substrate 1, which includes sapphire, Si or SiC. Furthermore, the active regions 10 have been provided with an insulation layer 3, which may in part already be applied onto the first semiconductor layer 2 before the epitaxial growth of the active regions 10, and may therefore be used as a mask for the growth of the active regions 10. The insulation layer 3 has been structured, for example by a photolithographic method, in such a way that it covers regions of the side surfaces of the active regions 10, as described above in connection with FIGS. 1B and 1C. The insulation layer 3 is an oxide layer, in particular an $SiO_2$ layer.

FIG. 2B schematically represents a subsequent process step in which a current spreading layer 4, which includes a transparent conductive oxide, for example ITO, has been applied onto the active regions 10. As an alternative, a metal layer or a combination of a metal layer and a transparent conductive oxide layer may be used as the current spreading layer 4.

In a further intermediate step, represented in FIG. 2C, a mask layer 8, for example a photoresist layer, has been applied onto the current spreading layer 4.

In the further intermediate step represented in FIG. 2D, the mask layer 8 has been ablated to such an extent that it ends below the upper side regions 19 of the active regions 10 in the vertical direction. The ablation of the mask layer 8 may for example be carried out by an etching process, in particular by an etching process with an oxygen plasma. Furthermore, a further etching process has been carried out in order to remove the current spreading layer 4 from those upper side regions 19 which are not covered by the mask layer 8. This may be carried out by means of a wet chemical etching process or by means of a dry etching process.

In the intermediate step represented in FIG. 2E, the mask layer 8 has been removed. The upper side regions 19 of the active regions 10 are now freed from the current spreading layer 4.

In the intermediate step represented in FIG. 2F, a transparent dielectric layer 9 has been applied onto the current spreading layer 4 and fully planarizes the latter. In particular, the transparent dielectric layer 9 fully fills the intermediate spaces, between the active regions 10, which have been covered by the current spreading layer 4. The transparent dielectric layer 9 may, in particular, be an oxide layer, in particular an $SiO_2$ layer. As an alternative to a transparent dielectric layer 9, in this step it would also be possible to apply an opaque or reflective layer which planarizes the active regions 10.

In the further intermediate step represented in FIG. 2G, the transparent dielectric layer 9 and underlying parts of the active regions 10 have been partially ablated. The material ablation may, in particular, be carried out by a mechanical method, for example grinding, lapping or polishing. In particular, the material ablation may be carried out by chemical-mechanical polishing (CMP). The material ablation is in particular carried out to such an extent that the upper side regions 19 of the active regions 10 are ablated. This optional intermediate step may be advantageous in order to reduce leakage currents on the upper side regions 19 and/or in order to amplify guided modes in the active regions.

In the intermediate step represented in FIG. 2H, a further part of the transparent dielectric layer 9 has been applied onto the previously exposed surface. The further part of the transparent dielectric layer 9 advantageously includes the same material as the initially applied part of the transparent dielectric layer 9. In this case, no optically active interface is formed between the lower and upper parts of the transparent dielectric layer 9. Furthermore, depressions 23 in the transparent dielectric layer 9 have been produced in the intermediate step of FIG. 2H, for example by a photolithographic method in combination with an etching process.

In a further intermediate step, represented in FIG. 2I, a converter material has been applied into the previously produced depressions 23 of the transparent dielectric layer 9. The converter material may, for example, include quantum dots and be applied by an aerosol jet method. As an alternative, other configurations of the converter material and methods for applying the converter material are also possible. For example, the converter material may be lithographically structured after the deposition. It is also possible for the converter material to be formed by epitaxial layers, which may be applied by bonding and subsequently structured.

In the intermediate step represented in FIG. 2J, excess converter material, which covers the surface of the transparent dielectric layer 9 outside the depressions, has been removed by a polishing process. In this way, first luminescence conversion elements 21 have been produced in the depressions 23 of the transparent dielectric layer 9.

The method steps represented in FIGS. 2H to 2J may subsequently be repeated in order to produce second conversion elements 22 over a second group of active regions 10. For example, after the method step of FIG. 2J, a further transparent dielectric layer 16 is applied, depressions are subsequently produced therein, a second converter material is applied into the depressions and excess converter material is removed by a polishing process. Subsequently, the second luminescence conversion elements 22 produced in this way may be covered with further material of the transparent dielectric layer 16 in order to protect them against external influences. As represented in FIG. 2K, the luminescence conversion elements 21, 22 are advantageously arranged entirely in depressions of the transparent dielectric layers 9, 16.

It is also possible for the first and second luminescence conversion elements 21, 22 to be produced in the same dielectric layer. For example, the recesses for the first and second luminescence conversion elements 21, 22 may be produced simultaneously, and the converter materials for forming the first luminescence conversion elements 21 and second luminescence conversion elements 22 may then be introduced selectively into the recesses intended for them in a transparent dielectric layer.

In the intermediate step represented in FIG. 2L, the optoelectronic semiconductor component has been connected to an auxiliary carrier 26 by means of a connecting layer 25, for example an adhesive layer, on a side opposite the growth substrate 1.

As represented in FIG. 2M, the growth substrate 1 is subsequently separated, for example by a laser lift-off method or alternatively by a mechanical method such as etching, grinding and/or polishing. At the same time or subsequently, the first semiconductor layer 2 is also removed. In this way, in particular, the n-type semiconductor regions of the 11 active regions 10 are exposed so that they can be contacted individually.

In the intermediate step represented in FIG. 2N, the active regions 10 have respectively been provided with an n-contact 6. In particular, the active regions 10 respectively include a separate n-contact 6. Furthermore, a depression which extends as far as the current spreading layer 4 has been produced in the insulation layer 3. A p-contact for electrical contacting of the current spreading layer 4 has been applied in the depression. The n-contacts 6 and the p-contact 5 may respectively be configured as metal layers. As an alternative, the n-contacts 6 and/or the p-contact 5 may be formed by a combination of a transparent conductive oxide layer and a metal layer. In this way, the reflection of the contacts may advantageously be increased.

In the intermediate step represented in FIG. 2O, the n-contacts 6 and the p-contact 5 have been connected to a carrier substrate 15 that includes the electronic circuit 18 for individual driving of the active regions 10.

In order to complete the optoelectronic semiconductor component 20 shown in FIG. 1A, the auxiliary carrier 26 and optionally the connecting layer 25 are subsequently removed.

Figure 3:
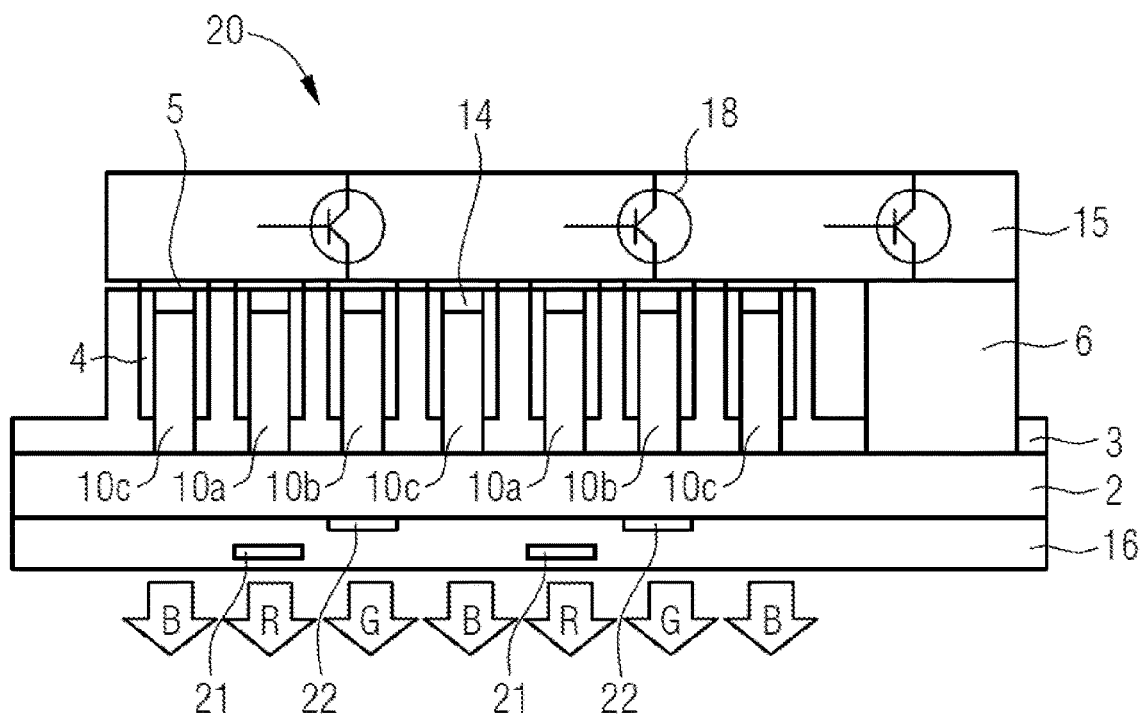
FIG. 3 shows a schematic representation of a cross section through an optoelectronic semiconductor component according to a second exemplary embodiment.

FIG. 3 shows a second exemplary embodiment of the optoelectronic semiconductor component 20. The second exemplary embodiment differs from the first exemplary embodiment particularly in that the carrier substrate 15 is arranged on a side opposite the original growth substrate. The active regions 10a, 10b, 10c include separate p-contacts 5, which are respectively connected to the p-type semiconductor region 13 of the active regions 10a, 10b, 10c. Furthermore, the active regions 10a, 10b, 10c include a common n-contact 6 which is connected to the first semiconductor layer 2. The first semiconductor layer 2 is, in particular, an n-doped semiconductor layer which is connected to the n-type semiconductor regions 11 of the active regions 10a, 10b, 10c. As in the first exemplary embodiment, the carrier substrate 15 advantageously contains an electronic circuit 18 for individual driving of the active regions 10a, 10b, 10c.

Arranged on a side of the first semiconductor layer 2 opposite the active regions 10a, 10b, 10c, there is a transparent dielectric layer 16 in which the luminescence conversion elements 21, 22 are embedded. In particular, the active regions 10a of a first group are respectively followed in the emission direction by a first luminescence conversion element 21. The first luminescence conversion element 21 is suitable for converting the primary radiation emitted by the active regions 10a, blue light, into first secondary radiation R, particularly into red light. The active regions 10b of a second group are respectively followed in the emission direction by a second luminescence conversion element 22. The second luminescence conversion element 22 is suitable for converting the primary radiation emitted by the active regions 10b, blue light, into second secondary radiation G, particularly into green light. Furthermore, as in the first exemplary embodiment, the active regions 10c of a third group are respectively not followed by a luminescence conversion element, so that they emit the primary radiation B, in particular blue light.

Further advantageous configurations of the second exemplary embodiment may be found from the preceding description of the first exemplary embodiment and from the exemplary embodiment, described below, of a method for producing an optoelectronic semiconductor component 20 according to the second exemplary embodiment.

FIGS. 4A to 4H schematically represent intermediate steps of the exemplary embodiment for the production of the optoelectronic semiconductor component according to the second exemplary embodiment.

Figure 4A:
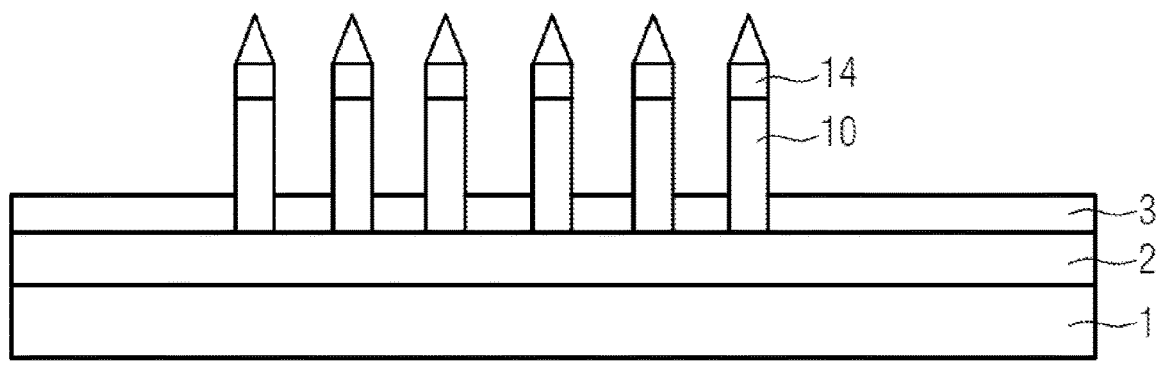
FIGS. 4A to 4L show schematically represented intermediate steps in a further exemplary embodiment of a method for producing the optoelectronic semiconductor component.

In the intermediate step represented in FIG. 4A, active regions 10 have been epitaxially grown on a first semiconductor layer 2, which includes n-doped GaN. The first semiconductor layer 2 is grown on a growth substrate 1, which includes sapphire, Si or SiC. Furthermore, the active regions 10 have been provided with an insulation layer 3, which may in part already be applied onto the first semiconductor layer 2 before the epitaxial growth of the active regions 10, and may therefore be used as a mask for the growth of the active regions 10. The insulation layer 3 is an oxide layer, in particular an $SiO_2$ layer. The active regions 10 include a p-doped or undoped region 14 on the upper side.

Figure 4B:
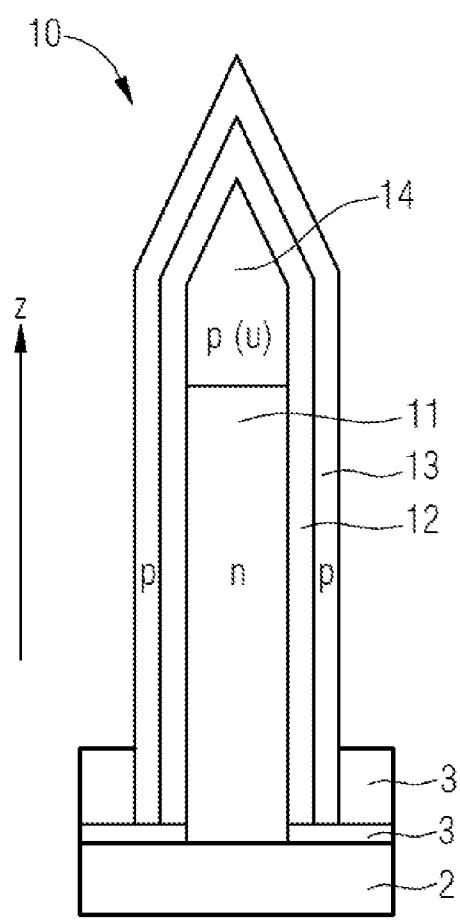

This is illustrated in a detail view of an active region 10 in FIG. 4B. Unlike in the first exemplary embodiment, in the second exemplary embodiment not all of the core region of the core-shell nanorods or core-shell microrods is formed by the n-type semiconductor region 11. Rather, a first part of the core region is initially grown as an n-type semiconductor region 11, and a second part of the core region is subsequently grown over the n-type semiconductor region 11 as a p-doped or undoped region 14, which in particular forms the tips of the active regions 10. Only after this are the active layer 12 and the p-type semiconductor region 13 grown over the core region formed by the n-type semiconductor region 11 and the p-doped or undoped semiconductor region 14.

Figure 4C:
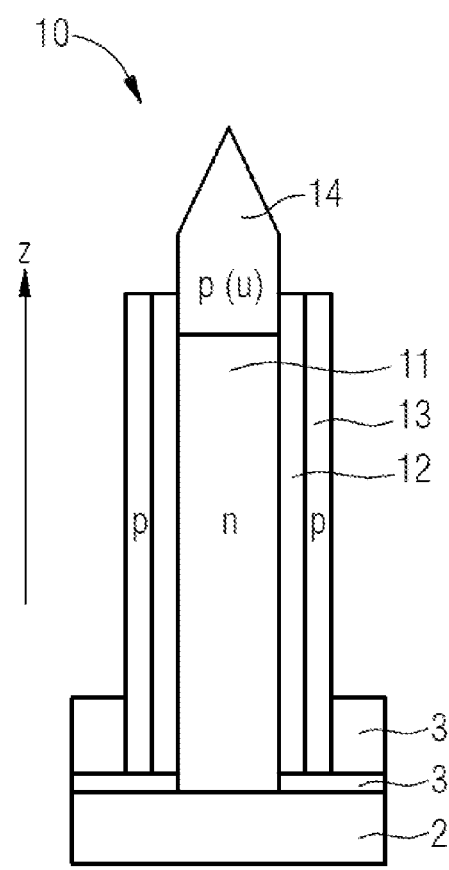
Figure 4D:
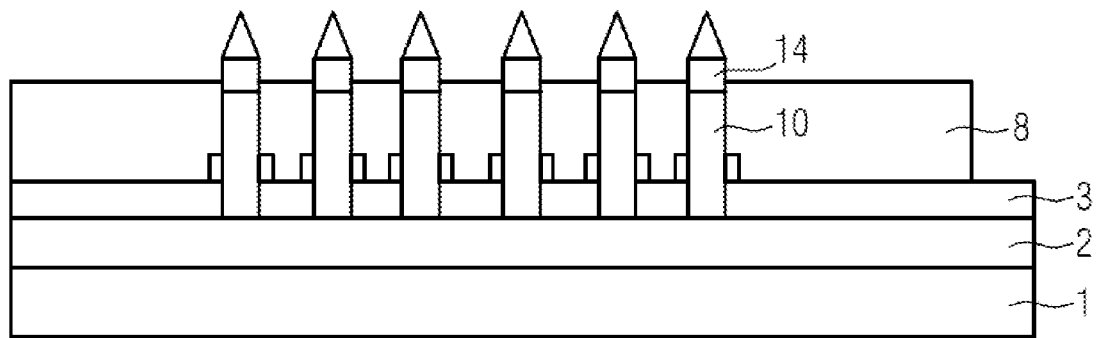

As represented in FIG. 4C, the p-type semiconductor region 13 and the active layer 12 are subsequently removed in the region of the tips of the active regions 10. This may, in particular, be carried out by an etching process. To this end, as represented in FIG. 4D, before the etching process is carried out, a suitable mask layer 8 is applied and structured in such a way that only the tips of the active regions 10 are exposed. In a non-limiting embodiment, the exposed p-doped or n-doped semiconductor regions 14 are additionally passivated, for example by plasma etching.

Figure 4E:
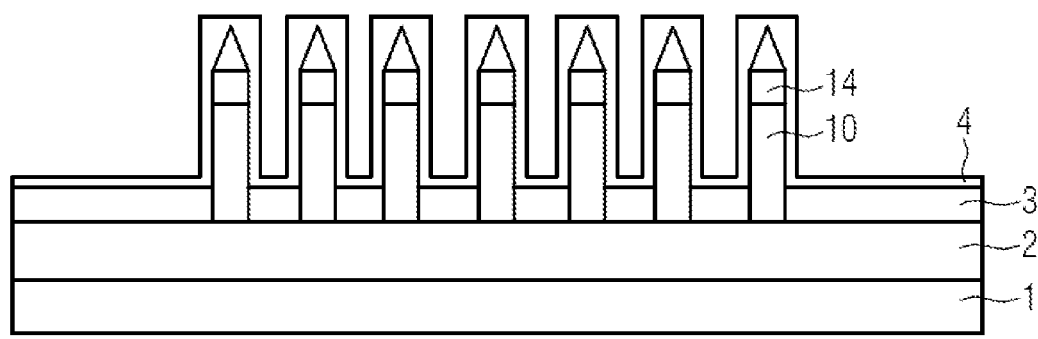

In the intermediate step represented in FIG. 4E, a current spreading layer 4, which includes a transparent conductive oxide, for example ITO, or alternatively a metal, has initially been applied surface-wide onto the active regions 10.

Figure 4F:
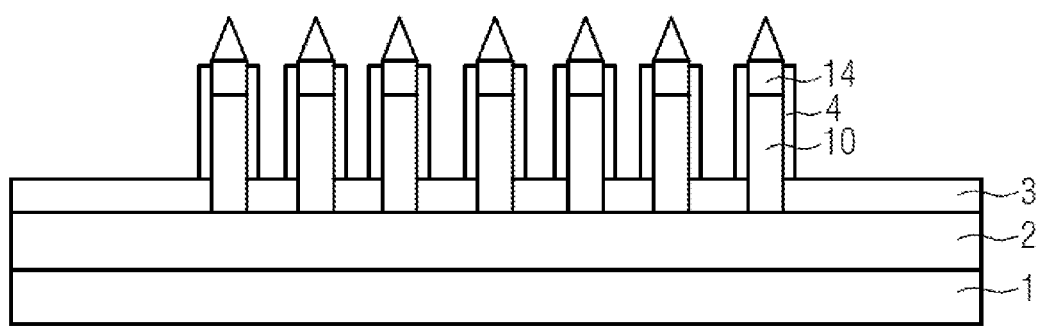

In the intermediate step represented in FIG. 4F, the current spreading layer 4 has been removed by an anisotropic etching process from the tips of the active regions 10 as well as from regions of the insulation layer 3 in intermediate spaces between the active regions 10 and outside the active regions 10.

Figure 4G:
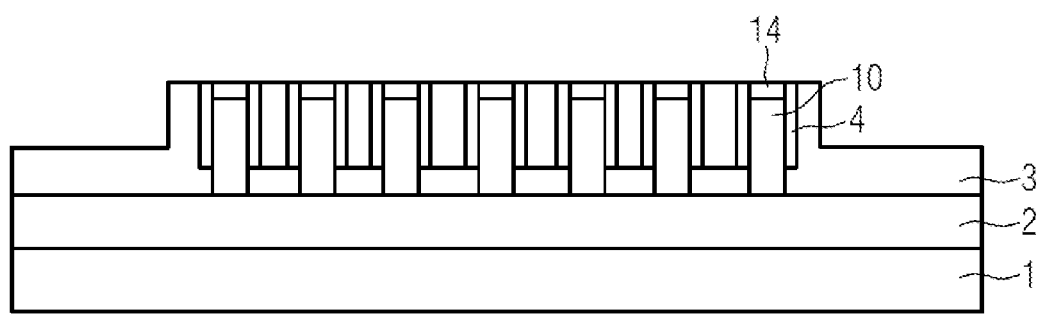

In the intermediate step represented in FIG. 4G, further material of the insulation layer 3 has been applied, particularly in order to fill the intermediate spaces between the active regions 10. Subsequently, parts of the insulation layer 3 and parts of the p-doped or undoped regions 14 of the active regions 10 have been partially ablated. The material ablation may in particular be carried out by a mechanical method, for example grinding, lapping or polishing. In particular, the material ablation may be carried out by chemical-mechanical polishing (CMP). The material ablation is carried out, in particular, to such an extent that the p-doped or undoped regions 14 of the active regions 10 and the current spreading layer 4 are partially exposed.

Figure 4H:
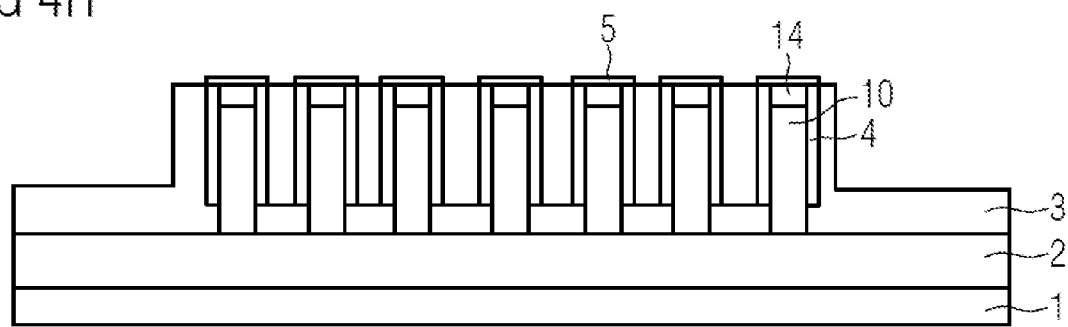

In a further method step, represented in FIG. 4H, p-contacts 5 have been applied onto the active regions 10 in such a way that they are respectively adjacent to the current spreading layer 4. In this way, the p-contacts 5 are respectively connected electrically conductively to the p-type semiconductor regions 13 by means of the current spreading layer 4. In particular, in this way an ohmic contact is produced between the p-contacts 5, which in particular include a metal, and the current spreading layer 4. Between the metal of the p-contacts 5 and the passivated p-doped or undoped regions 14, on the other hand, a Schottky contact is formed, so that there is no electrically conductive connection at these positions. Each active region 10 is advantageously provided with a separate p-contact 5. The separate p-contacts 5 make it possible for the active regions 10 to be individually drivable in the finished optoelectronic semiconductor component.

Figure 4I:
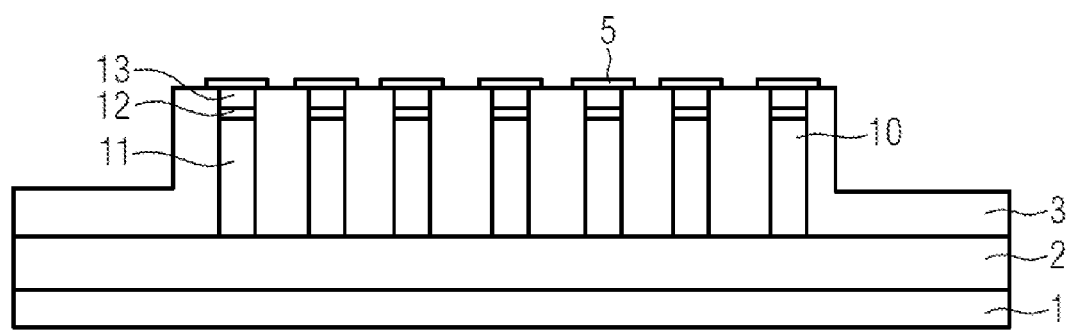

As an alternative to the method steps described above, in which the active regions 10 are configured as core-shell nanorods or microrods, in the second exemplary embodiment it is also possible for the active regions 10 to be configured as disk-type nanorods or microrods, as have been described above in connection with FIG. 1C. Such a variant is schematically represented in FIG. 4I. In this configuration, the n-type semiconductor region 11, the active layer 12 and the p-semiconductor region 13 follow one another in the main extent direction, in particular the vertical direction, in the active regions 10. In this variant, the p-contacts 5 may be applied directly onto the p-type semiconductor regions 13, without a current spreading layer 4 being applied beforehand. In this variant, the active regions 10 are enclosed only by the insulation layer 3. In particular, the active regions 10 do not include a current spreading layer 4 in this case.

Figure 4J:
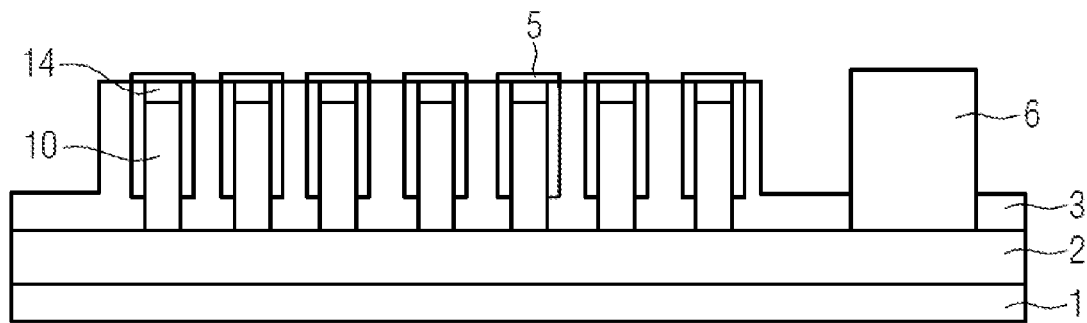

FIG. 4J represents a next intermediate step of the method, once more with reference to the example of active regions 10 in the form of core-shell nanorods or microrods. This intermediate step and the further intermediate steps represented may be carried out in a similar way when configuring the active regions 10 as disk-type nanorods or microrods. In the insulation layer 3, a recess has been produced, in which the first semiconductor layer 2 has been exposed, which is in particular an n-doped GaN layer and is electrically connected to the n-type semiconductor regions of the active regions 10. An n-contact 6, which establishes an electrical connection to the first semiconductor layer 2, has been produced in the recess. By means of the first semiconductor layer 2, the active regions are connected to the common n-contact 6.

Figure 4K:
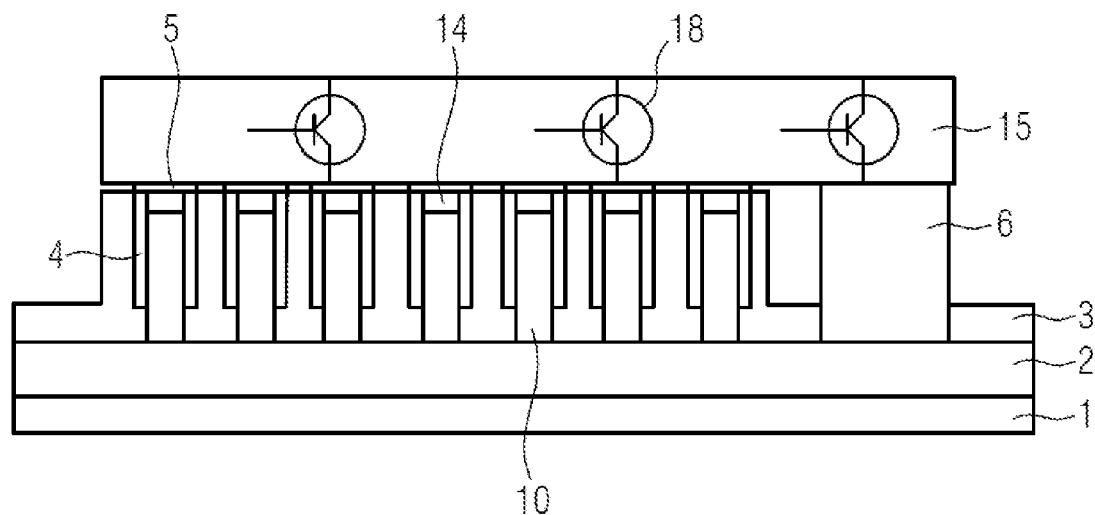

In a further intermediate step, represented in FIG. 4K, the p-contacts 5 and the n-contact 6 have been connected to a carrier substrate 15 that includes an electronic circuit 18 for the individual driving of active regions 10. The carrier substrate 15 may be configured as in the first exemplary embodiment. In contrast to the first exemplary embodiment, however, the carrier substrate 15 is arranged on a side opposite the growth substrate 1.

Figure 4L:
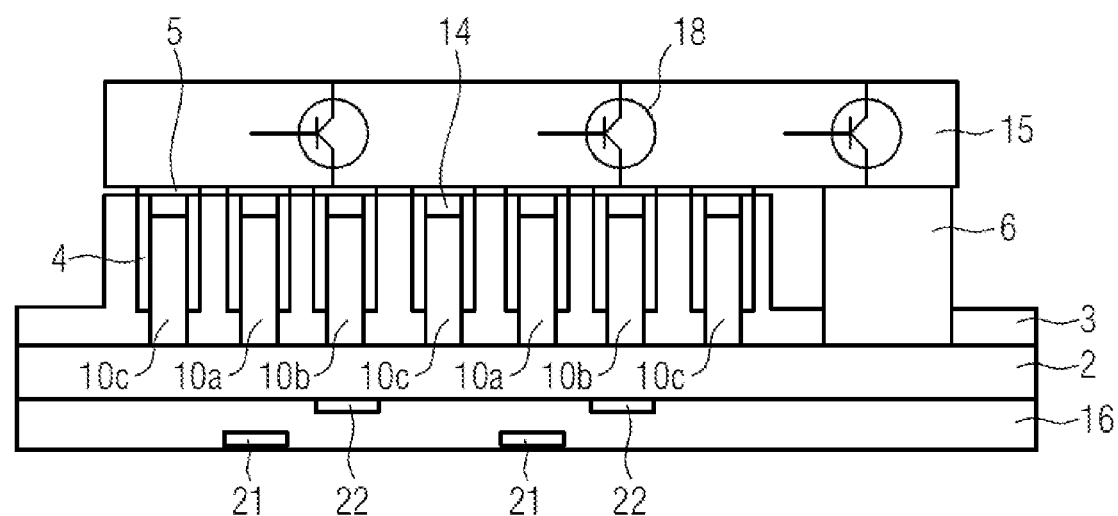

In the further intermediate step represented in FIG. 4L, the growth substrate 1 has been separated from the first semiconductor layer 2. On the first semiconductor layer 2, by further method steps which may be carried out in a similar way to the steps explained in FIGS. 2H to 2K and are therefore not described again, a transparent dielectric layer 16 has been applied in which first luminescence conversion elements 21 and second luminescence conversion elements 22 are embedded. As in the first exemplary embodiment, the luminescence conversion elements 21, 22 have been applied onto the active regions 10a, 10b, 10c in such a way that a first luminescence conversion element 21 for conversion of the primary radiation into first secondary radiation is respectively arranged after a group of first active regions 10a in the emission direction. A second luminescence conversion element 22 for conversion of the primary radiation to second secondary radiation is respectively arranged after a group of second active regions 10b. Furthermore, a third group of active regions 10c is not followed in the emission direction by a luminescence conversion element, so that the third group of active regions 10c emit the primary radiation.

Figure 5:
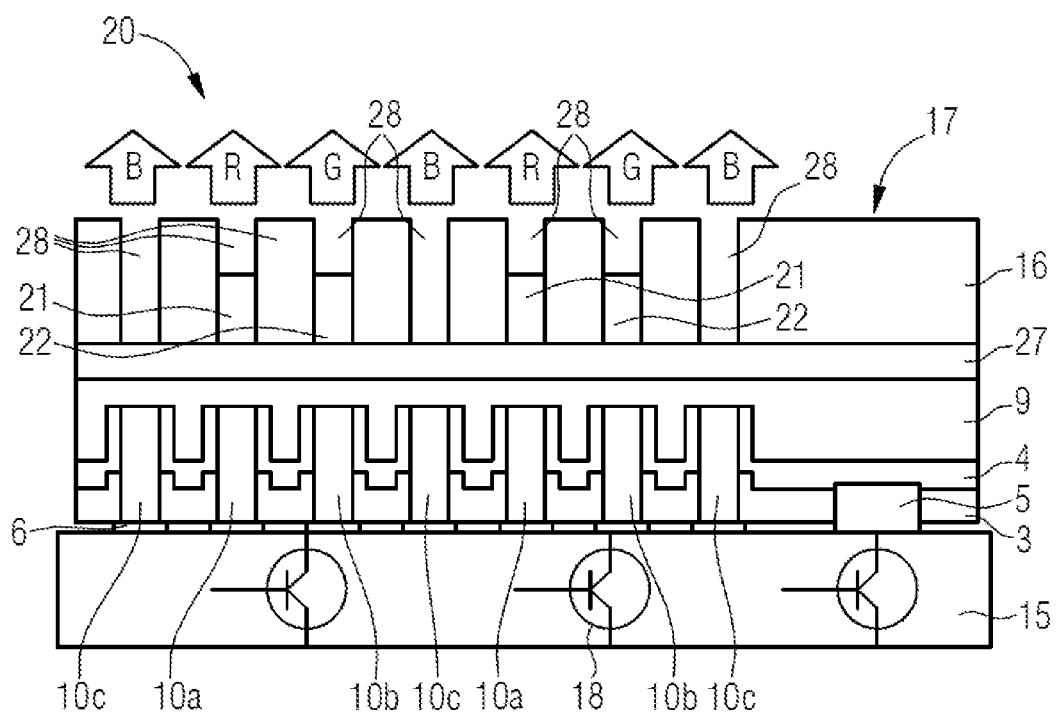
FIG. 5 shows a schematic representation of a cross section through an optoelectronic semiconductor component according to a third exemplary embodiment.

FIG. 5 represents a third exemplary embodiment of the optoelectronic semiconductor chip 20. In this exemplary embodiment, the active regions 10a, 10b, 10c are respectively followed in the emission direction by a waveguide 28. The first and second luminescence conversion elements 21, 22 are advantageously respectively arranged in a waveguide 28. The waveguides 28 may, for example, be arranged in a dielectric layer 16. This configuration has the advantage that the primary radiation B, the first secondary radiation R and the second secondary radiation G are respectively emitted directionally.

Advantageously, in this exemplary embodiment or in one of the other exemplary embodiments, a wavelength-selective mirror 27 may respectively be arranged between the active regions 10a, 10b, 10c and the luminescence conversion elements 21, 22. The wavelength-selective mirror 27 advantageously has a reflection behavior such that it reflects at least the predominant part of the first secondary radiation R and second secondary radiation G generated by the luminescence conversion elements 21, 22 and is substantially radiation-transmissive for the primary radiation B. The wavelength-selective mirror 27 may, in particular, be adapted to reflect red or green light and to transmit blue light. In this way, advantageously, more light is emitted in the emission direction and the scattering of light at the luminescence conversion elements 21, 22 is reduced. Furthermore, the absorption of converted radiation in the optoelectronic semiconductor component 20 is reduced and the efficiency is increased.

In the exemplary embodiment of FIG. 5, the wavelength-selective mirror 27 is arranged on the transparent dielectric layer 9. If an opaque dielectric layer is used instead of the transparent dielectric layer 9, the wavelength-selective mirror 27 is advantageously applied directly onto the upper side regions of the active regions 10a, 10b, 10c.

The configurations of the optoelectronic semiconductor component 20 having the waveguides 28 and the wave-selective mirror 27 may be used individually or in combination with one another. In this case, as represented in FIG. 5, the optoelectronic semiconductor component may be configured differently, for example like the exemplary embodiment represented in FIG. 1. These configurations may, however, also be used advantageously in other embodiments of the optoelectronic semiconductor component, and particularly in the second exemplary embodiment as represented in FIG. 3.

Figure 6:
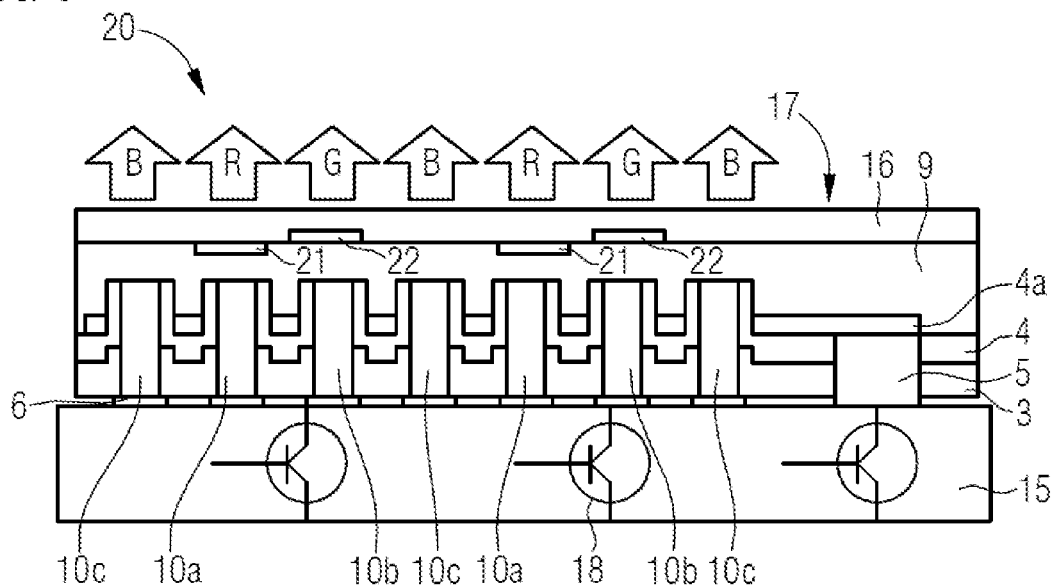
FIG. 6 shows a schematic representation of a cross section through an optoelectronic semiconductor component according to a fourth exemplary embodiment.

FIG. 6 represents a fourth exemplary embodiment of the optoelectronic semiconductor chip 20. This exemplary embodiment corresponds substantially to the exemplary embodiment of FIG. 1. The difference from the exemplary embodiment of FIG. 1 is that the current spreading is carried out by a current spreading layer 4 consisting of a transparent conductive oxide and, applied thereon, a further current spreading layer 4a consisting of a metal. The p-contact 5 is fed through the transparent conductive oxide layer 4 to the current spreading layer 4a, which includes a metal.

As in the exemplary embodiment of FIG. 1, a part of the transparent dielectric layer 9 is located between the active regions 10a, 10b, 10c and the luminescence conversion elements 21, 22. If an opaque dielectric layer is used instead of the transparent dielectric layer 9, the luminescence conversion elements 21, 22 are advantageously applied directly onto the upper side regions of the active regions 10a, 10b, 10c. This applies in a similar way for the exemplary embodiment of FIG. 1.

Further details of the optoelectronic semiconductor component of the fourth exemplary embodiment may be found from the description of FIG. 1 and are therefore not explained again here. The configuration of the current spreading layer as a combination of a transparent conductive oxide layer 4 and a metal layer 4a may also advantageously be used in other embodiments of the optoelectronic semiconductor component, particularly also in the exemplary embodiments represented in FIGS. 3 and 4.

The invention is not restricted by the description with the aid of the exemplary embodiments. Rather, the invention includes any new feature and any combination of features, which includes in particular any combination of features in the patent claims, even if this feature or this combination per se is not explicitly indicated in the patent claims or exemplary embodiments.

LIST OF REFERENCES 1 substrate
2 first semiconductor layer
3 insulation layer
4 current spreading layer
4a metal current spreading layer
5 p-contact
6 n-contact
7 electrically insulating layer
8 mask layer
9 transparent dielectric layer
10 active region
10a active region of the first group
10b active region of the first group
10c active region of the first group
11 n-type semiconductor region
12 active layer
13 p-type semiconductor region
14 p-doped or undoped semiconductor region
15 carrier substrate
16 transparent dielectric layer
17 radiation exit surface
18 electronic circuit
19 upper side regions
20 optoelectronic semiconductor component
21 first luminescence conversion element
22 second luminescence conversion element
23 depression
25 connecting layer
25 auxiliary carrier
26 wavelength-selective mirror
27 waveguide
28 z main extent direction of the active regions
B primary radiation
R first secondary radiation
G second secondary radiation

The invention claimed is:

1. An optoelectronic semiconductor component for the emission of multicolored radiation comprising;
at least one dielectric layer; and
a multiplicity of active regions arranged next to one another, which are configured as microrods or nanorods and are configured to generate primary electromagnetic radiation, wherein:
a first group of the active regions is respectively followed in an emission direction by a first luminescence conversion element, which is suitable for converting the primary electromagnetic radiation into first secondary radiation;
a second group of the active regions is respectively followed in the emission direction by a second luminescence conversion element, which is suitable for converting the primary electromagnetic radiation into second secondary radiation; wherein the primary radiation, the first secondary radiation, and the second secondary radiation have different colors; and
one or more waveguides following the active regions in the emission direction;
wherein the one or more waveguides are arranged in the dielectric layer;
wherein the first luminescence conversion element and the second luminescence conversion element are each arranged in depressions of the at least one dielectric layer.

2. The optoelectronic semiconductor component according to claim 1,
further comprising a third group of the active regions that is not followed in an emission direction by a luminescence conversion element, so that the active regions of the third group emit the primary electromagnetic radiation in the emission direction.

3. The optoelectronic semiconductor component according to claim 1,
wherein spacings between neighboring active regions of the multiplicity of active regions are less than 10 µm.

4. The optoelectronic semiconductor component according to claim 1,
wherein the each active region of the multiplicity of active regions have a lateral extent of between 20 nm and 5 µm.

5. The optoelectronic semiconductor component according to claim 1,
wherein the first conversion element and the second luminescence conversion element are arranged in such a way that each active region of the first group is respectively assigned a separate first luminescence conversion element and each active region of the second group is respectively assigned a separate second luminescence conversion element.

6. The optoelectronic semiconductor component according to claim 1,
wherein the first luminescence conversion element and the second luminescence conversion element respectively have a lateral extent between one and five times as great as the lateral extent of the active regions;
and/or wherein the lateral extent of the luminescence conversion elements is not more than half of a spacing between the active regions.

7. The optoelectronic semiconductor component according to claim 1,
wherein a wavelength-selective mirror is arranged between the active regions and the first luminescence conversion element and the second luminescence conversion element.

8. The optoelectronic semiconductor component according to claim 1,
wherein the active regions are individually drivable.

9. The optoelectronic semiconductor component according to claim 1,
further comprising a carrier substrate; and an electronic circuit for individual driving of the active regions integrated into the carrier substrate.

10. The optoelectronic semiconductor component according to claim 1,
wherein the optoelectronic semiconductor component does not comprise a growth substrate.

11. The optoelectronic semiconductor component according to claim 2,
wherein the optoelectronic semiconductor component is an RGB display having a multiplicity of pixels, each pixel comprising an active region of the first group, an active region of the second group, and an active region of the third group.

12. The optoelectronic semiconductor component according to claim 1,
wherein the active regions
have a main extent direction,
comprise an n-type semiconductor region, which forms a core region,
comprise an active layer, which covers the core region at least in directions transverse to the main extent direction of the active region, and
comprise a p-type semiconductor region, which forms a top layer that covers the active layer at least in directions transverse to the main extent direction of the active region.

13. The optoelectronic semiconductor component according to claim 1,
wherein the active regions
have a main extent direction,
in the main extent direction, an n-type semiconductor region, an active layer and a p-type semiconductor region are arranged above one another in such a way that they do not overlap in the lateral direction.

14. The optoelectronic semiconductor component according to claim 1,
further comprising a current spreading layer which covers the active regions at least partially.

15. The optoelectronic semiconductor component according to claim 14,
wherein the current spreading layer comprises a transparent conductive oxide and/or a metal.

* * * * *